US009399698B2

(12) United States Patent
Wigglesworth et al.

(10) Patent No.: US 9,399,698 B2
(45) Date of Patent: Jul. 26, 2016

(54) PROCESSES FOR PURIFYING DIKETOPYRROLOPYRROLE COPOLYMERS

(71) Applicant: Xerox Corporation, Norwalk, CT (US)

(72) Inventors: Anthony James Wigglesworth, Oakville (CA); Yiliang Wu, Oakville (CA); Cuong Vong, Hamilton (CA)

(73) Assignee: XEROX CORPORATION, Norwalk, CT (US)

( * ) Notice: Subject to any disclaimer, the term of this patent is extended or adjusted under 35 U.S.C. 154(b) by 52 days.

(21) Appl. No.: 14/169,415

(22) Filed: Jan. 31, 2014

(65) Prior Publication Data

US 2015/0218304 A1    Aug. 6, 2015

(51) Int. Cl.
*C08G 61/12* (2006.01)

(52) U.S. Cl.
CPC .......... *C08G 61/126* (2013.01); *C08G 2261/12* (2013.01); *C08G 2261/1412* (2013.01); *C08G 2261/312* (2013.01); *C08G 2261/3221* (2013.01); *C08G 2261/3222* (2013.01); *C08G 2261/3223* (2013.01); *C08G 2261/3243* (2013.01); *C08G 2261/334* (2013.01); *C08G 2261/344* (2013.01); *C08G 2261/364* (2013.01); *C08G 2261/411* (2013.01); *C08G 2261/414* (2013.01); *C08G 2261/712* (2013.01)

(58) Field of Classification Search
CPC .................................................... C08G 61/126
See application file for complete search history.

(56) References Cited

U.S. PATENT DOCUMENTS

| | | | |
|---|---|---|---|
| 3,985,552 A * | 10/1976 | Edwards | 75/426 |
| 4,870,156 A * | 9/1989 | Pino et al. | 528/487 |
| 6,451,459 B1 | 9/2002 | Tieke et al. | |
| 7,910,684 B2 | 3/2011 | Li | |
| 7,928,181 B2 | 4/2011 | Li | |
| 7,932,344 B2 | 4/2011 | Li | |
| 8,158,744 B1 | 4/2012 | Wu et al. | |
| 8,378,059 B2 | 2/2013 | Rauwald et al. | |
| 8,558,109 B2 | 10/2013 | Wigglesworth et al. | |
| 8,563,851 B2 | 10/2013 | Wu et al. | |
| 8,575,477 B1 | 11/2013 | Coggan et al. | |
| 8,598,299 B2 | 12/2013 | Wu et al. | |
| 8,629,238 B2 | 1/2014 | Dueggeli et al. | |
| 2007/0228359 A1* | 10/2007 | Heim et al. | 257/40 |
| 2009/0065766 A1 | 3/2009 | Li | |
| 2009/0065878 A1 | 3/2009 | Li | |
| 2009/0302311 A1 | 12/2009 | Turbiez et al. | |
| 2010/0038631 A1 | 2/2010 | Li | |
| 2010/0041861 A1 | 2/2010 | Li | |
| 2011/0028644 A1 | 2/2011 | Brown et al. | |
| 2011/0031475 A1 | 2/2011 | Wu et al. | |
| 2011/0065232 A1 | 3/2011 | Wu et al. | |
| 2011/0084252 A1 | 4/2011 | Wu et al. | |
| 2011/0114184 A1 | 5/2011 | Brown et al. | |
| 2011/0204351 A1 | 8/2011 | Heim et al. | |
| 2011/0215313 A1 | 9/2011 | Dueggeli et al. | |
| 2011/0240981 A1* | 10/2011 | Dueggeli et al. | 257/40 |
| 2012/0059140 A1 | 3/2012 | Hayoz et al. | |
| 2012/0071617 A1 | 3/2012 | Dueggeli et al. | |
| 2012/0085992 A1* | 4/2012 | Beaujuge et al. | 257/40 |
| 2012/0161117 A1 | 6/2012 | Chen et al. | |
| 2012/0186652 A1 | 7/2012 | Pan et al. | |
| 2012/0264906 A1 | 10/2012 | Marks et al. | |
| 2013/0085256 A1 | 4/2013 | He et al. | |
| 2013/0109821 A1 | 5/2013 | He et al. | |
| 2013/0140494 A1 | 6/2013 | Wu et al. | |
| 2013/0200351 A1* | 8/2013 | Uetani et al. | 257/40 |
| 2013/0240784 A1 | 9/2013 | Hirata et al. | |
| 2013/0240792 A1 | 9/2013 | Wigglesworth et al. | |
| 2013/0240841 A1 | 9/2013 | Wu et al. | |
| 2014/0020739 A1 | 1/2014 | Yang et al. | |
| 2014/0042371 A1 | 2/2014 | Blouin et al. | |

FOREIGN PATENT DOCUMENTS

WO    WO 2012032949 A1 *  3/2012

OTHER PUBLICATIONS

Guram et al. Org. Lett. 2006, 8, 1787-1789.*
Sigma-Aldrich, Chem Files, Products for Suzuki Coupling, 2002.*
Sigma-Aldrich, Ammonium hydroxide, ACS Reagent, Production Information, 2003.*
Kaikeke et al. Analytical Sciences 2001, 17, 411-415.*
Nielsen et al. Macromolecules 2005, 38, 658-659.*
Anil S. Guram, et al., "New Air0Stable Catalysts for General and Efficient Suzuki-Miyura Cross-Coupling Reactions of Heteroaryl Chlorides," Organic Letters, 2006, vol. 8, No. 9, pp. 1787-1789. © 2006 American Chemical Society.
Remmers, et al., "Synthesis, optical absorptioin and fluorescence of new poly (ρ-pheylene)-related polymers," Macromal,Rapid Commun., vol. 17, pp. 239-252 (1996).
Wallow, et al., "Highly Efficient and Accelerated Suzuki Aryl Couplings Mediated by Phosphine-FreePalladium Sources," Journal of Org. Chem., vol. 59, pp. 5034-5037 (1994).

* cited by examiner

*Primary Examiner* — Matthew Coughlin
(74) *Attorney, Agent, or Firm* — Richard M. Klein; Fay Sharpe LLP (57) ABSTRACT

Processes for purifying diketopyrrolopyrrole (DPP) copolymers are disclosed. An organic phase containing the DPP copolymer is treated with an aqueous ammonia solution and then with a palladium scavenger. The DPP copolymer is then isolated, and has a very low palladium content. The resulting DPP copolymer has high mobility.

20 Claims, 4 Drawing Sheets

PROCESSES FOR PURIFYING DIKETOPYRROLOPYRROLE COPOLYMERS

BACKGROUND

The present disclosure relates to processes for preparing diketopyrrolopyrrole (DPP) copolymers. The copolymers, electronic devices using such copolymers, and methods for preparing such electronic devices are also disclosed.

Diketopyrrolopyrrole (DPP) copolymers are a promising class of high-performance semiconducting copolymers with potential applications in various electronic devices, such as solution-processed photovoltaic devices and organic thin-film transistors (OTFTs). It would be desirable to provide processes that can improve the performance of high molecular weight DPP copolymers.

BRIEF DESCRIPTION

The present disclosure provides, in various embodiments, processes for purifying DPP copolymers. Generally, the DPP copolymer is treated with an aqueous ammonia solution, and then with a palladium scavenger. The resulting copolymer has very low residual metal content. When the DPP copolymer is used as a semiconducting material, it exhibits very high mobility.

Disclosed in various embodiments herein are processes for obtaining a diketopyrrolopyrrole copolymer having low palladium content, comprising: receiving an organic phase containing the diketopyrrolopyrrole copolymer; treating the organic phase with an aqueous ammonia solution; treating the organic phase with a palladium scavenger; and isolating the diketopyrrolopyrrole copolymer from the organic phase to obtain the diketopyrrolopyrrole copolymer having low palladium content.

Upon processing, the diketopyrrolopyrrole copolymer may have a palladium content of less than 150 ppm and a total metal content of less than 300 ppm.

The resulting diketopyrrolopyrrole copolymer may have a low palladium content has a weight average molecular weight of 20,000 or higher when measured using high-temperature gel permeation chromatography in trichlorobenzene at 140° C.

In particular embodiments, the diketopyrrolopyrrole copolymer having low palladium content has a polydispersity index (PDI) of less than 4.0.

The organic phase may include an organic solvent selected from the group consisting of anisole, toluene, ethylbenzene, o-xylene, m-xylene, p-xylene, trimethylbenzene, mesitylene, tetrahydronapthalene, and mixtures thereof.

In some embodiments, the palladium scavenger is sodium diethyldithiocarbamate, ethylenediamine tetraacetic acid (EDTA), or ethylene diamine. In other embodiments, the palladium scavenger is a polymer containing a monomer selected from the group consisting of styryl sulfonic acid, vinyl pyridine, styryl thiol, and mercaptoethyl acrylate. In yet other embodiments, the palladium scavenger includes a functional group selected from the group consisting of thiourea, benzyl amine, imidazolylalkyl, aminoalkyl, thioalkyl, imidazolylalkyl amino, mercaptophenyl amino, and aminoethyl amino.

The aqueous ammonia solution may contain from about 2% to about 30% ammonia (v/v). The organic phase can be treated with the aqueous ammonia solution at a temperature of 20° C. to 80° C., for a time period of 30 minutes to 90 minutes.

The diketopyrrolopyrrole copolymer can be isolated from the organic phase by extraction, precipitation, and vacuum filtration.

The organic phase containing the diketopyrrolopyrrole copolymer can be prepared by: reacting a reaction mixture that contains a diketopyrrolopyrrole monomer, an aryl comonomer, a palladium catalyst, an organic phase, and an aqueous phase, so that the diketopyrrolopyrrole copolymer is formed; and separating the organic phase containing the diketopyrrolopyrrole copolymer from the reaction mixture. The reacting may occur at a temperature of from 60° C. to 120° C. The reacting may occur for a time period of from about 6 hours to about 36 hours. The palladium catalyst can be present in the amount of from about 0.1 mole % to about 10 mole % of the reaction mixture, including from about 1 mole % to about 5 mole %. In particular embodiments, the aqueous phase contains from 1 to 10 molar equivalents of a base, and wherein the volume ratio of organic phase to aqueous phase in the reaction mixture is from about 1:1 to about 5:1.

The diketopyrrolopyrrole monomer may have the structure of Formula (I), as described further herein. The aryl comonomer may be an aryl boronate having the structure of Formula (III) as described further herein. The palladium catalyst may have the structure of Formula (IV) as described further herein.

These and other non-limiting characteristics of the disclosure are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

A more complete understanding of the components, processes and apparatuses disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

The modifier "about" used in connection with a quantity is inclusive of the stated value and has the meaning dictated by the context (for example, it includes at least the degree of error associated with the measurement of the particular quantity). When used in the context of a range, the modifier "about" should also be considered as disclosing the range defined by the absolute values of the two endpoints. For example, the range of "from about 2 to about 10" also discloses the range "from 2 to 10."

The term "comprising" is used herein as requiring the presence of the named component and allowing the presence of other components. The term "comprising" should be construed to include the term "consisting of", which allows the presence of only the named component, along with any impurities that might result from the manufacture of the named component.

The present disclosure relates to processes for purifying diketopyrrolopyrrole (DPP)-based copolymers. Generally, the DPP-based copolymers of the present disclosure are prepared using an optimized Suzuki polycondensation method. The Suzuki reaction uses non-toxic organoboron compounds as a reactant and does not produce any toxic byproducts during the polymerization reaction. The copolymers are prepared using palladium (Pd)-based catalysts (e.g. Pd(PPh$_3$)$_4$), including highly active Pd-catalysts substituted with aryl-di-tertbutyl-phosphine ligands. Using this class of catalysts, DPP-based copolymers with high molecular weight can be prepared in good yield. The purification processes improve the performance of the DPP-based copolymers. In the purification processes of the present disclosure, a diketopyrrolopyrrole (DPP) copolymer is treated with an aqueous ammonia solution, then with a palladium scavenger. The resulting isolated DPP copolymer has low palladium content and low total residual metal content.

The DPP copolymer produced according to the processes of the present disclosure can generally have the structure of Formula (A):

Formula (A)

wherein $R_1$ and $R_2$ are independently hydrogen, alkyl, substituted alkyl, poly(ethylene glycol), poly(propylene glycol), aryl, substituted aryl, heteroaryl, or substituted heteroaryl; $Ar_1$ and $Ar_2$ are independently aryl, substituted aryl, heteroaryl, or substituted heteroaryl; p and q are each an integer of 0 or greater, and (p+q) is at least 2; M is a conjugated moiety; b is 0 to 5; and n is from 2 to about 5,000.

The term "alkyl" refers to a radical composed entirely of carbon atoms and hydrogen atoms which is fully saturated. The alkyl radical may be linear, branched, or cyclic. The alkyl radical can be univalent or divalent, i.e. can bond to one or two different non-hydrogen atoms.

The term "poly(ethylene glycol)" refers to a radical of the formula —(OCH$_2$CH$_2$)$_m$OR, where m is an integer, and R is either hydrogen or alkyl. Exemplary poly(ethylene glycol)s include tri(ethylene glycol) monomethyl ether (m=3, R=CH$_3$) and tetra(ethylene glycol) monomethyl ether (m=4, R=CH$_3$).

The term "poly(propylene glycol)" refers to a radical of the formula —(OCH$_2$CH$_2$CH$_2$)$_m$OR, where m is an integer, and R is either hydrogen or alkyl.

The term "aryl" refers to an aromatic radical composed entirely of carbon atoms and hydrogen atoms. When aryl is described in connection with a numerical range of carbon atoms, it should not be construed as including substituted aromatic radicals. For example, the phrase "aryl containing from 6 to 10 carbon atoms" should be construed as referring to a phenyl group (6 carbon atoms) or a naphthyl group (10 carbon atoms) only, and should not be construed as including a methylphenyl group (7 carbon atoms). The aryl radical may be univalent or divalent.

The term "heteroaryl" refers to a cyclic radical composed of carbon atoms, hydrogen atoms, and a heteroatom within a ring of the radical, the cyclic radical being aromatic. The heteroatom may be nitrogen, sulfur, or oxygen. Exemplary heteroaryl groups include thienyl, pyridinyl, and quinolinyl. When heteroaryl is described in connection with a numerical range of carbon atoms, it should not be construed as including substituted heteroaromatic radicals. Note that heteroaryl groups are not a subset of aryl groups.

The term "substituted" refers to at least one hydrogen atom on the named radical being substituted with another functional group, such as halogen, —CN, —NO$_2$, —COOH, and —SO$_3$H. An exemplary substituted alkyl group is a perhaloalkyl group, wherein one or more hydrogen atoms in an alkyl group are replaced with halogen atoms, such as fluorine, chlorine, iodine, and bromine. Besides the aforementioned functional groups, an alkyl group may also be substituted with an aryl or heteroaryl group. An aryl or heteroaryl group may also be substituted with alkyl or alkoxy. Exemplary substituted aryl groups include methylphenyl and methoxyphenyl. Exemplary substituted heteroaryl groups include 3-methylthienyl.

Generally, each alkyl group independently contains from 6 to 30 carbon atoms. Similarly, each aryl group independently contains from 4 to 24 carbon atoms. A heteroaryl group contains from 2 to 30 carbon atoms.

Some exemplary alkyl groups include methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, cyclopentyl, cyclohexyl, cycloheptyl, and isomers thereof such as 2-ethylhexyl, 2-hexyldecyl, 2-octyl-dodecyl, or 2-decyltetradecyl.

Some exemplary aryl and substituted aryl groups include phenyl, polyphenyl, and naphthyl; alkoxyphenyl groups, such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl, other aryl groups listed as exemplary M groups, and combinations thereof.

Some exemplary heteroaryl groups include thiophene, thienothiophene, furan, selenophene, benzodithiophene, oxazole, isoxazole, pyridine, thiazole, isothiazole, imidazole, triazole, pyrazole, furazan, thiadiazole, oxadiazole, pyridazine, pyrimidine, pyrazine, indole, isoindole, indazole, chromene, quinoline, isoquinoline, cinnoline, quinazoline, quinoxaline, naphthylidine, phthalazine, purine, pteridine, thienofuran, imidazothiazole, benzofuran, benzothiophene, benzoxazole, benzthiazole, benzthiadiazole, benzimidazole, imidazopyridine, pyrrolopyridine, pyrrolopyrimidine, pyridopyrimidine, and combinations thereof.

Each $Ar_1$ and $Ar_2$ unit may be independently selected from the group consisting of the following structures:

and combinations thereof, wherein each R' is independently selected from hydrogen, alkyl, substituted alkyl, poly(ethylene glycol), poly(propylene glycol), aryl, substituted aryl, heteroaryl, substituted heteroaryl, halogen, alkoxy, alkylthio, trialkylsilyl, —CN, or —$NO_2$; and g is 0 to 5.

The term "alkoxy" refers to an alkyl radical which is attached to an oxygen atom, e.g. —O—$C_nH_{2n+1}$. The oxygen atom attaches to the core of the compound.

The term "alkylthio" refers to an alkyl radical which is attached to a sulfur atom, e.g. —S—$C_nH_{2n+1}$. The sulfur atom attaches to the core of the compound.

The term "trialkylsilyl" refers to a radical composed of a tetravalent silicon atom having three alkyl radicals attached to the silicon atom, i.e. —$Si(R)_3$. The three alkyl radicals may be the same or different. The silicon atom attaches to the core of the compound.

The term "halogen" refers to fluorine, chlorine, iodine, and bromine.

In particular embodiments, $A_1$ and $Ar_2$ are independently selected from:

and combinations thereof, wherein each R' is as described above.

In Formula (A), the M moiety must be different from an $Ar_1$ or $Ar_2$ unit, but can otherwise be chosen from the same moieties that $A_1$ and $Ar_2$ are selected from. For example, if $Ar_1$ and $Ar_2$ are unsubstituted thiophene, then M can be a substituted thiophene. In addition, the M moiety has a single ring structure. For example, biphenyl would be considered to be two M moieties, so M is phenyl and b=2. In particular embodiments, M is a conjugated moiety containing from about 4 to about 30 carbon atoms. Specific examples of the M moiety/moieties are further described for Ar" when discussing Formula (III) below.

Initially, the diketopyrrolopyrrole (DPP) copolymer can be synthesized using a reaction mixture that contains a diketopyrrolopyrrole (DPP) monomer aryl, comonomer, palladium catalyst, organic solvent (i.e. organic phase), and an aqueous phase. The reaction mixture is then reacted to form the DPP copolymer, with the palladium catalyst being used to catalyze the reaction. The synthesis of the DPP copolymer is first described, and the purification processes are then discussed further herein.

The diketopyrrolopyrrole (DPP) monomer used in the reaction mixture may have the structure of Formula (I):

Formula (I)

wherein $Ar_1$ and $Ar_2$ are independently aryl, substituted aryl, heteroaryl, or substituted heteroaryl; $R_1$ and $R_2$ are independently hydrogen, alkyl, substituted alkyl, poly(ethylene glycol), poly(propylene glycol), aryl, substituted aryl, heteroaryl, or substituted heteroaryl; and $Y_1$ and $Y_2$ are independently halogen.

In more specific embodiments, the diketopyrrolopyrrole (DPP) monomer may have the structure of Formula (II):

Formula (II)

wherein $R_1$ and $R_2$ are independently hydrogen, alkyl, substituted alkyl, poly(ethylene glycol), poly(propylene glycol), aryl, or substituted aryl; $Y_1$ and $Y_2$ are independently halogen; each $Z_1$ and $Z_2$ is independently alkyl, substituted alkyl, aryl, substituted aryl, heteroaryl, substituted heteroaryl, halogen, alkoxy, alkylthio, trialkylsilyl, —CN, or —$NO_2$; and e and f are independently from 0 to 2.

In particular embodiments of Formula (I) and Formula (II), $Y_1$ and $Y_2$ are bromine. In some other particular embodiments of Formula (I) and Formula (II), $R_1$ and $R_2$ are hydrogen or alkyl.

Figure 1:
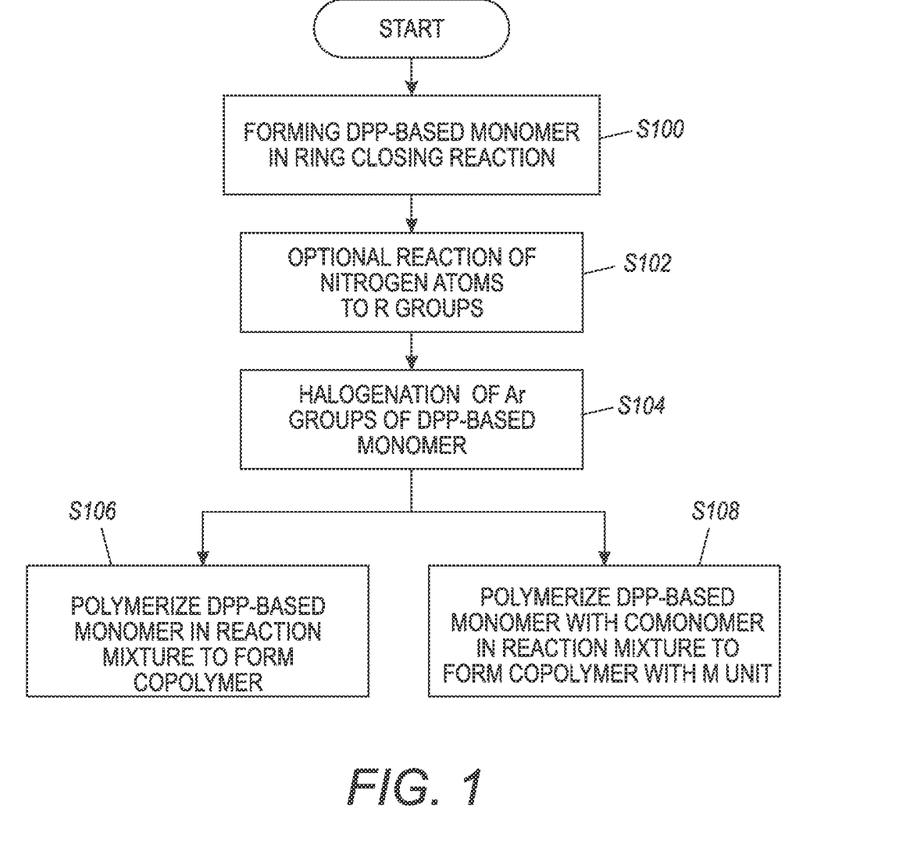
FIG. 1 is a diagram illustrating processes for making a DPP copolymer.

The diketopyrrolopyrrole (DPP) monomer can be prepared by a four-step process, as illustrated in FIG. 1. At step S100, a DPP (diketopyrrolopyrrole) moiety may be formed by reacting 2 moles of an appropriate nitrile or a Schiff base with one mole of a succinic acid diester in the presence of a base and an organic solvent. For example, a carbonitrile (Ar—CN) for forming the selected Ar group (e.g., thiophenecarbonitrile) is reacted with a succinate (e.g. diisopropyl succinate or di-n-butyl succinate) under suitable conditions for ring closure of the DPP moiety to form a monomer M1 of the general formula:

M1 where Ar is as defined above.

For example, step S100 may be carried out in solution in the presence of a sodium alkoxide, such as t-$C_5H_{11}$ONa, which may be formed in situ, followed by neutralization with an organic acid, such as glacial acetic acid. The reaction may be performed at a suitable reaction temperature, such as about 85° C.

At step S102, the H groups on the nitrogen atoms of the monomer (M1) obtained at step S100 may optionally be converted from H to a selected R group by reaction of the monomer with a halide of the formula R—Y, where R is as defined above (other than H) and Y is a halogen which may be selected from chlorine, bromine, and iodine. A monomer of the following structure (M2) is thus formed:

M2

When R is aryl, substituted aryl, heteroaryl, or substituted heteroaryl, an optional palladium or copper catalyst may be required.

Step S102 may be performed in solution at a suitable reaction temperature, such as about 40 to 180° C. (e.g., about 120° C.). The reaction may be carried out in a suitable solvent, such as dimethylformamide, in the presence of an appropriate base, such as an alkali metal hydroxide or carbonate and an optional crown ether, such as 18-crown-6. Suitable bases include NaH, NaOH, KOH, t-BuONa, t-BuOK, $Na_2CO_3$, $K_2CO_3$ and the like. Usually, the molar ratio of the base to compound M1 is chosen in the range of from 0.5:1 to 50:1.

At step S104, the Ar groups are halogenated with a halogenating reagent, such as N-halosuccinimides, bromine, chlorine, or iodine, to form a monomer of the general formula:

wherein Y is a halogen, such as bromine, chlorine, or iodine. Step S104 may be carried out in any suitable non-reactive medium, such as chloroform, e.g., at room temperature or above. This results in the DPP monomer of Formula (M3).

Continuing with step S106, the DKPP monomer (M3) can be polymerized to form a copolymer where no M unit is present, or in other words where b=0.

Alternatively, at step S108, the DKPP monomer (M3) is then copolymerized with a comonomer to form a copolymer, wherein the comonomer provides a moiety that is different from the Ar moiety of monomer M3. This may be one way to include a different $Ar_1$ or $Ar_2$ unit into the copolymer. This may also be a way to introduce an M unit, so that b>0. Again, the M unit should be different from the $Ar_1$ and $Ar_2$ units. The exact number of b units within each polymer strand and between M3 monomers may vary, and should be considered statistically.

Step S106 or S108 may be performed in solution in the presence of a di-tin compound, such as an hexaalkyl-di-tin or hexaaryl-di-tin compound such as hexamethylditin, hexa-n-butylditin, or hexaphenylditin, and a catalyst suitable for coupling reactions or for polycondensation reactions, optionally in the presence of copper(I) iodide. A suitable coupling catalyst is a palladium-based catalyst, e.g., a tetrakis(triarylphosphonium)-palladium catalyst, such as tetrakis(triphenylphosphine) palladium(O) (Pd(PPh$_3$)$_4$), Pd(PPh$_3$)$_2$Cl$_2$, PdOAc$_2$, Pd(dba)$_3$:P(o-Tol)$_3$, or derivatives thereof. Usually, the catalyst is added in a molar ratio of DKPP monomer to the catalyst in the range of from about 1000:1 to about 10:1, e.g., from about 100:1 to about 30:1. A suitable solvent for the reaction may be a mixture of THF and 1-methyl-2-pyrrolidinone (NMP). The reaction may be carried out under reflux at a temperature which is at or slightly above the boiling point of the solvent.

For example, the comonomer can have the formula G-M-G, where M is the conjugated moiety and G is a reactive group that depends on the polycondensation reaction. For example, in a Suzuki reaction, the reactive group G contains a boron atom. An additional base, such as $K_2CO_3$, $Cs_2CO_3$, $K_3PO_4$, KF, or CsF, is also required for a Suzuki reaction. Alternatively, in a Stille reaction, the reactive group G is a trialkylstannyl group such as —SnMe$_3$ or —Sn(n-Bu)$_3$.

In particular embodiments, the reaction is a Suzuki reaction that uses an aryl boronate as the comonomer. The aryl boronate used in the reaction mixture may have the structure of Formula (III):

BE-Ar''—BE  Formula (III)

wherein BE represents the boronic portion, and Ar" is a conjugated moiety. In particular embodiments, BE is selected from the group consisting of:

and Ar" is selected from the group consisting of:

wherein each R' is independently selected from hydrogen, alkyl, substituted alkyl, poly(ethylene glycol), poly(propylene glycol), aryl, substituted aryl, heteroaryl, substituted heteroaryl, halogen, alkoxy, alkylthio, trialkylsilyl, —CN, or —NO$_2$; and X is C or Si. In this regard, the cyclic boronates are preferred due to their stability under ambient conditions, ease of handling, and reactivity under the polymerization conditions.

In particular embodiments, Ar" is selected from the group consisting of

The palladium catalyst used in the reaction mixture contains a palladium metal atom. In particular embodiments, the palladium catalyst is substituted with aryl-di-tertbutyl-phosphine ligands. In particular embodiments, the palladium catalyst used in the reaction has the structure of Formula (IV):

Formula (IV)

wherein $R^a$ is H, —N(CH$_3$)$_2$, or —CF$_3$. In particular embodiments, the palladium catalyst used in the reaction is Pd-132, which has the structure shown below:

Pd-132

Pd-132 is especially suited for the polymerization reactions described herein.

The organic phase and the aqueous phase are used as solvents, and are immiscible with each other. The organic solvent used to form the organic phase may be selected from anisole, toluene, ethylbenzene, o-xylene, m-xylene, p-xylene, xylene, 1,2,4-trimethylbenzene, mesitylene, tetrahydronaphthalene, and mixtures thereof of such water-immiscible organic solvents. Toluene and o-xylene are preferred for the organic phase.

The aqueous phase generally includes a base selected from K$_2$CO$_3$, K$_3$PO$_4$, KHCO$_3$, Na$_2$CO$_3$, NaHCO$_3$, and mixtures thereof. The base may be added in amounts sufficient to attain a starting pH (i.e. prior to reaction) of about 8 to about 14. If desired, a water-miscible solvent, such as dimethylformamide (DMF), dimethylacetamide (DMA), n-methyl pyrrolidone (NMP), dioxolane, dioxane, or tetrahydrofuran (THF) may also be present in the aqueous phase, or used instead of water. The aqueous phase neutralizes the acid that is generated during the polymerization reaction.

The volume ratio of organic phase to aqueous phase may be from about 10:1 to about 2:1. In specific embodiments, the solvent is a mixture of o-xylene with an aqueous solution containing about 1 to about 10 molar equivalents of a base, in a volume ratio of about 3:1 (organic:aqueous). In more specific embodiments, the aqueous solution contains about 2 to about 5 molar equivalents of the base. In a specific example, the aqueous solution is 2M aqueous K$_2$CO$_3$.

If desired, the reaction mixture may also include a phase transfer catalyst. An exemplary phase transfer catalyst is known by the name "aliquat 336" or "Starks' catalyst", and is a quaternary ammonium salt containing a mixture of octyl and decyl sidechains. The phase transfer catalyst is usually present in small amounts.

The palladium catalyst is present in an amount of from about 3 mole % to about 5 mole % of the reaction mixture. The molar ratio of the diketopyrrolopyrrole (DPP) monomer to the aryl boronate is generally about 1:1.

The reaction mixture is generally deoxygenated to prevent catalyst poisoning. The reaction mixture is then reacted to form the DPP copolymer. The reaction typically involves heating the reaction mixture for a given time period. Agitation is useful. The reaction also generally occurs under an inert atmosphere, e.g. argon or nitrogen, again to prevent catalyst poisoning. In embodiments, the reaction mixture is heated to a temperature of from 60° C. to 120° C., including about 90° C. The reaction mixture is heated for a time period of from about 2 hours to about 96 hours, including a heating time period of about 18 to about 30 hours, or about 6 hours to about 36 hours. The reaction optimizes the catalyst loading, the aqueous base in the solvent, and the reaction time. The heating of the reaction mixture can be performed by placing the reaction mixture in a heating mantle, in an oil bath, on a heating block, or in a sand bath. However, an alternative method of heating is using microwave heating, which reduces the time that the heating needs to be applied. The DPP copolymer is formed as a result of this reaction, and can subsequently be purified.

Figure 2:
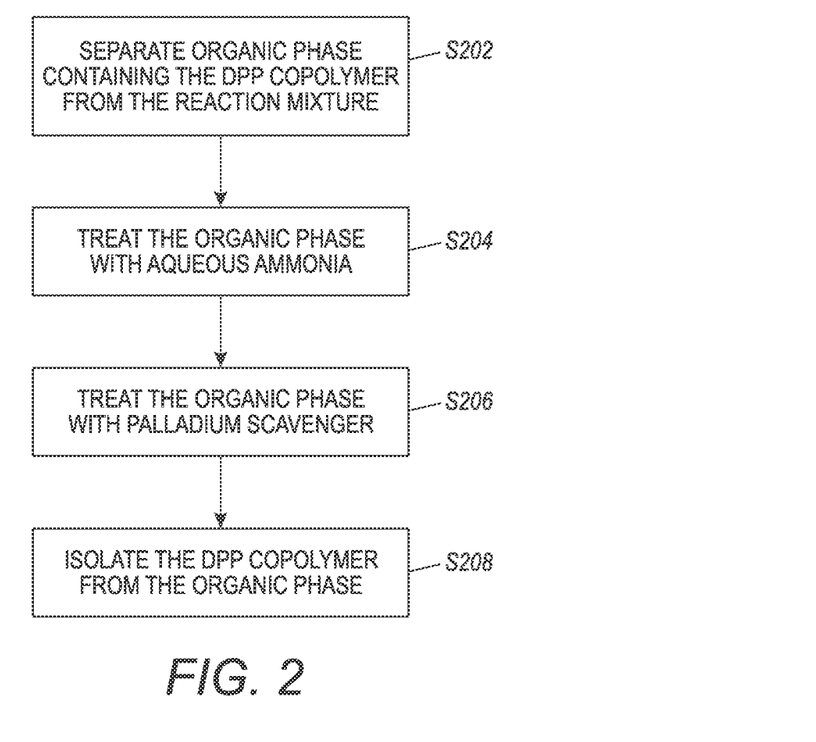
FIG. 2 is a diagram illustrating the purification processes of the present disclosure.

After the reacting has occurred, the diketopyrrolopyrrole (DPP) copolymer is present in the organic phase of the reaction mixture. The purification process is illustrated in FIG. 2. Beginning with step S202, the organic phase is separated from the reaction mixture for further purification and isolation of the DPP copolymer.

Next, in step S204, the organic phase (containing the DPP copolymer) is treated with an aqueous ammonia solution. This is a mixture of ammonia and water. The aqueous solution may contain from about 2% to about 30% ammonia and from about 70% to about 98% water (v/v). The organic phase can be stirred during this treatment. The treatment with aqueous ammonia occurs for a period of about 30 minutes to about 90 minutes. The treatment with aqueous ammonia may occur at a temperature of about 20° C. to about 80° C., including an elevated temperature from about 50° C. to about 70° C. The volume ratio (v/v) of aqueous ammonia solution to be added to the organic phase should be from about 1:1 to about 1:4 (e.g. 1 parts by volume aqueous ammonia to 4 parts by volume of organic phase). This treatment can be applied more than once. Without being bound by theory, it appears that the ammonia treatment leaches residual palladium out of the crude copolymer.

Next, in step S206, the organic phase is treated with a palladium scavenger. The palladium scavenger can be sodium diethyldithiocarbamate, ethylenediamine tetraacetic acid (EDTA), ethylene diamine, and the like. Other polymeric palladium scavengers are available under the trade name SMOPEX, and contain functional groups extending from a polypropylene or viscose backbone. Those functional groups can be included in the polymer by using monomers such as styryl sulfonic acid, vinyl pyridine, styryl thiol, and mercaptoethyl acrylate. Other commercially available Pd scavengers include those offered under the trade name QUADRAPURE and QUADRASIL. These scavengers include a matrix with functional groups such as thiourea, benzyl amine, imidazolylalkyl, aminoalkyl, thioalkyl, imidazolylalkyl amino, mercaptophenyl amino, and aminoethyl amino. The matrix is usually polystyrene or a silica. The amount of palladium scavenger to be added to the organic phase should be from about 20 to about 100 mg/g of, polymer, or from about 40 to about 60 mg/g of polymer. This treatment can last for a period of from about 1 hours to about 24 hours, and can be performed at a temperature of from about 40° C. to about 80° C.

Finally, in step S208, the diketopyrrolopyrrole copolymer is isolated from the organic phase. For example, the DPP copolymer can be precipitated using a non-solvent such as methanol, acetone, isoporopanol and mixtures thereof. Low molecular weight impurities can be removed by Soxhlet extraction using a polar solvent to remove low molecular weight polar impurities and residual metal ions, typically with methanol and/or acetone. Soxhlet extraction is then performed with a hydrocarbon solvent to remove low molecular weight oligomers, e.g. hexanes or heptanes. Finally, the purified polymer is extracted with CHCl$_3$ and precipitated with a non-solvent (e.g. methanol, acetone, isopropanol, or mixtures thereof), collected by vacuum filtration, and dried under vacuum.

As a result of the treatment with the palladium scavenger, the resulting diketopyrrolopyrrole copolymer has a low palladium content. In embodiments, the palladium content is less than 150 ppm, including less than 100 ppm and more preferably less than 50 ppm. The resulting diketopyrrolopyrrole copolymer can also have a total metal content of less than 300 ppm, including less than 150 ppm, and more desirably less than 100 ppm. Such metals include palladium (Pd), boron (B), and potassium (K).

The resulting DPP copolymer can have a weight average molecular weight (Mw) from about 20,000 to about 500,000, or from about 35,000 to about 100,000, or from about 30,000 to about 60,000. The molecular weight is measured using high-temperature gel permeation chromatography in trichlorobenzene at 140° C. The resulting DPP copolymer may have a polydispersity index (PDI) of less than 4.0, including less than 3.0. In embodiments, the Mw is at least 20,000 and the PDI is less than 4.0. It should be noted that every bond formed during the polymerization here is between two heteroaromatic rings.

As mentioned before, the resulting DPP copolymer can generally have the structure of Formula (A):

Formula (A)

wherein $R_1$, $R_2$, $Ar_1$, $Ar_2$, p, q, M, and N are as described above.

In some specific embodiments of Formula (A), $R_1$ and $R_2$ are the same. In others, $R_1$ and $R_2$ are both alkyl. In additional specific embodiments of Formula (A), b is zero. In others, the sum of (p+q) is at least 2, or is at least 4. The variable a may have a value of 1 to 5. The sum of (p+q) may be at most 20. In some embodiments, the sum of (p+q) is from 2 to 6. In still other embodiments, b may be 0 or 1.

In more specific embodiments of Formula (A), the DPP copolymer has the structure of Formula (B):

Formula (B)

wherein Ar is aryl, substituted aryl, heteroaryl, or substituted heteroaryl having a total of 4 to 24 carbon atoms; and n is from 2 to about 5,000. In more specific embodiments, Ar can be thiophene, 2,2'-bithiophene, thienothiophene, or benzodithiophene.

Specific exemplary DPP copolymers that can be made using the processes of the present disclosure include those of Formulas (1)-(26):

Formula (1)

Formula (2)

Formula (3)

Formula (4)

-continued

Formula (5)

Formula (6)

Formula (7)

Formula (8)

Formula (9)

Formula (10)

Formula (11)

Formula (12)

Formula (13)

Formula (14)

Formula (15)

Formula (16)

-continued

Formula (17)

Formula (18)

Formula (19)

Formula (20)

Formula (21)

Formula (22)

Formula (23)

Formula (24)

Formula (25)

Formula (26)

where $R_1$, $R_2$, and R' are as defined above, and n is from 2 to about 5,000.

The DPP copolymers can be used as semiconducting polymers. In this regard, the low palladium content appears to dramatically improve the charge carrier mobility of the DPP copolymer by effectively reducing the number of charge trapping sites, which allows a field-effect mobility of around 1 $cm^2/V \cdot sec$, and up to 10 $cm^2/V \cdot sec$, to be obtained, depending on the molecular weight of the copolymer.

Semiconductor compositions comprising the DPP copolymers are also disclosed. The semiconductor compositions may include a solvent in which the DPP copolymer is soluble. Exemplary solvents used in the solution may include chlorinated solvents such as chlorobenzene, chlorotoluene, dichlorobenzene, dichloroethane, chloroform, tetrachloroethane, and the like; alcohols and diols such as propanol, butanol, hexanol, hexanediol, etc.; hydrocarbons or aromatic hydrocarbons such as hexane, heptane, toluene, xylene, mesitylene, trimethyl benzene, ethyl benzene, tetrahydronaphthalene, decalin, methyl naphthalene, etc.; ketones such as acetone, methyl ethyl ketone, etc.; acetates, such as ethyl acetate; pyridine, tetrahydrofuran, and the like.

The semiconductor compositions can be used to form semiconducting layers in electronic devices such as, for example, thin film transistors, photovoltaic devices, light emitting diodes, light emitting transistors, sensors, and the like. In embodiment, the DPP copolymers can be used to form a layer of a thin film transistor or photovoltaic device.

Figure 3:
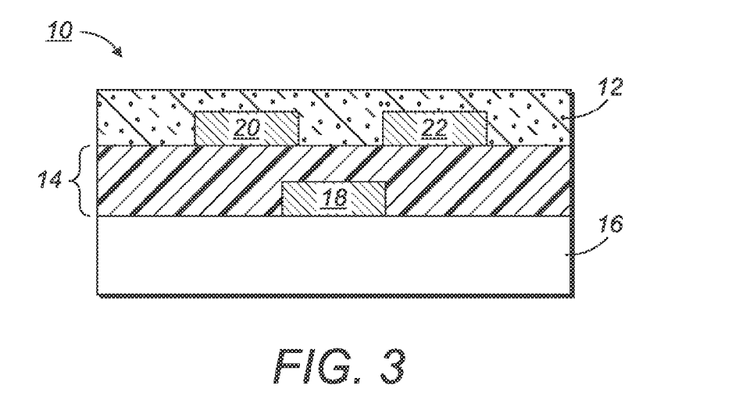
FIG. 3 is a diagram of a first embodiment of a thin film transistor (TFT) that can incorporate the DPP copolymer formed using the processes of the present disclosure.

FIG. 3 illustrates a bottom-gate bottom-contact TFT. The TFT 10 comprises a substrate 16 in contact with the gate electrode 18 and a gate dielectric layer 14. The gate electrode 18 is depicted here atop the substrate 16, but the gate electrode could also be located in a depression within the substrate. The gate dielectric layer 14 separates the gate electrode 18 from the source electrode 20, drain electrode 22, and the semiconducting layer 12. The semiconducting layer 12 runs over and between the source and drain electrodes 20 and 22. The semiconductor has a channel length between the source and drain electrodes 20 and 22.

Figure 4:
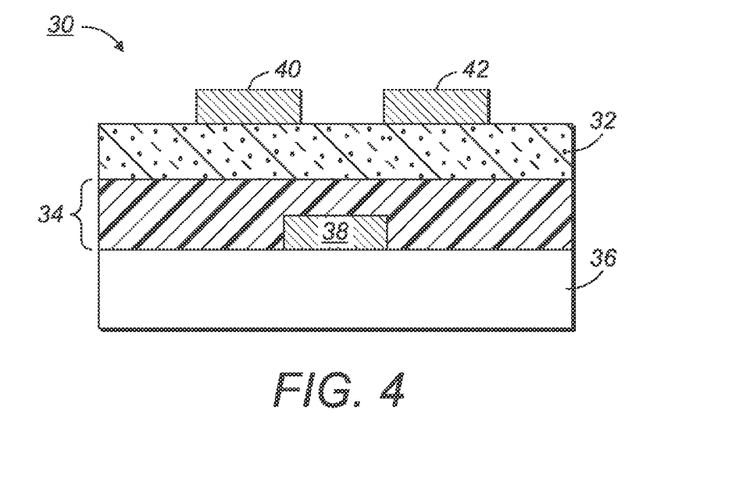
FIG. 4 is a diagram of a second TFT configuration which can incorporate a DPP copolymer.

FIG. 4 illustrates a bottom-gate top-contact TFT configuration. The TFT 30 comprises a substrate 36 in contact with the gate electrode 38 and a gate dielectric layer 34. The semiconducting layer 32 is placed on top of the gate dielectric layer 34 and separates it from the source and drain electrodes 40 and 42.

Figure 5:
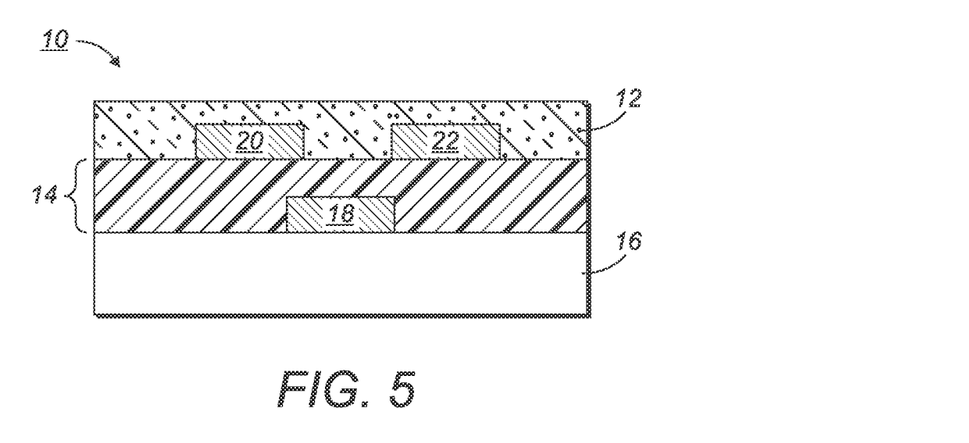
FIG. 5 is a diagram of a third TFT configuration which can incorporate a DPP copolymer.

FIG. 5 illustrates another bottom-gate bottom-contact TFT configuration. The TFT 50 comprises a substrate 56 which also acts as the gate electrode and is in contact with a gate dielectric layer 54. The source electrode 60, drain electrode 62, and semiconducting layer 52 are located atop the gate dielectric layer 54.

Figure 6:
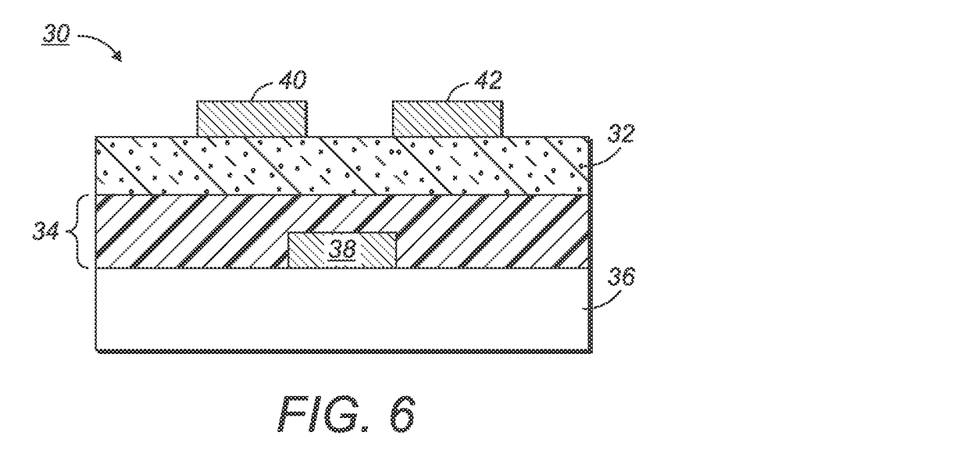
FIG. 6 is a diagram of a fourth TFT configuration which can incorporate a DPP copolymer.

FIG. 6 illustrates a top-gate top-contact TFT configuration. The TFT 70 comprises a substrate 76 in contact with the source electrode 80, drain electrode 82, and the semiconducting layer 72. The semiconducting layer 72 runs over and between the source and drain electrodes 80 and 82. The gate dielectric layer 74 is on top of the semiconducting layer 72. The gate electrode 78 is on top of the gate dielectric layer 74 and does not contact the semiconducting layer 72.

The semiconducting layer may be formed in an electronic device using conventional processes known in the art. In embodiments, the semiconducting layer is formed using solution depositing techniques. Exemplary solution depositing techniques include spin coating, blade coating, rod coating, dip coating, screen printing, ink jet printing, stamping, stencil printing, screen printing, gravure printing, flexography printing, and the like.

The semiconducting layer formed using the semiconductor composition can be from about 5 nanometers to about 1000 nanometers deep, including from about 20 to about 100 nanometers in depth. In certain configurations, the semiconducting layer completely covers the source and drain electrodes. The semiconductor channel width may be, for example, from about 5 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

The performance of a TFT can be measured by mobility. The mobility is measured in units of $cm^2/V \cdot sec$; higher mobility is desired. The resulting TFT using the semiconductor composition of the present disclosure may have a field effect mobility of at least 0.1 $cm^2/V \cdot sec$. The TFT of the present disclosure may have a current on/off ratio of at least $10^5$.

A thin film transistor generally includes a substrate, an optional gate electrode, source electrode, drain electrode, and a dielectric layer in addition to the semiconducting layer.

The substrate may be composed of materials including but not limited to silicon, glass plate, plastic film or sheet. For structurally flexible devices, plastic substrate, such as for example polyester, polycarbonate, polyimide sheets and the like may be preferred. The thickness of the substrate may be from about 10 micrometers to over 10 millimeters with an exemplary thickness being from about 50 to about 100 micrometers, especially for a flexible plastic substrate and from about 0.5 to about 10 millimeters for a rigid substrate such as glass or silicon.

The dielectric layer generally can be an inorganic material film, an organic polymer film, or an organic-inorganic composite film. Examples of inorganic materials suitable as the dielectric layer include silicon oxide, silicon nitride, aluminum oxide, barium titanate, barium zirconium titanate and the like. Examples of suitable organic polymers include polyesters, polycarbonates, poly(vinyl phenol), polyimides, polystyrene, polymethacrylates, polyacrylates, epoxy resin and the like. The thickness of the dielectric layer depends on the dielectric constant of the material used and can be, for example, from about 10 nanometers to about 500 nanometers. The dielectric layer may have a conductivity that is, for example, less than about $10^{-12}$ Siemens per centimeter (S/cm). The dielectric layer is formed using conventional processes known in the art, including those processes described in forming the gate electrode.

In the present disclosure, the dielectric layer may be surface modified with a surface modifier. Exemplary surface modifiers include organosilanes such as hexamethyldisilazane (HMDS), octyltrichlorosilane (OTS-8), octadecyltrichlorosilane (ODTS-18), and phenyltrichlorosilane (PTS). The semiconducting layer can be directly contacted with this modified dielectric layer surface. The contact may be complete or partial. This surface modification can also be considered as forming an interfacial layer between the dielectric layer and the semiconducting layer.

The gate electrode is composed of an electrically conductive material. It can be a thin metal film, a conducting polymer film, a conducting film made from conducting ink or paste, or the substrate itself, for example heavily doped silicon. Examples of gate electrode materials include but are not restricted to aluminum, gold, silver, chromium, indium tin oxide, conductive polymers such as polystyrene sulfonate-doped poly(3,4-ethylenedioxythiophene) (PSS-PEDOT), and conducting ink/paste comprised of carbon black/graphite. The gate electrode can be prepared by vacuum evaporation, sputtering of metals or conductive metal oxides, conventional lithography and etching, chemical vapor deposition, spin coating, casting or printing, or other deposition processes. The thickness of the gate electrode ranges for example from about 10 to about 200 nanometers for metal films and from about 1 to about 10 micrometers for conductive polymers. Typical materials suitable for use as source and drain electrodes include those of the gate electrode materials such as aluminum, gold, silver, chromium, zinc, indium, conductive metal oxides such as zinc-gallium oxide, indium tin oxide, indium-antimony oxide, conducting polymers and conducting inks. Typical thicknesses of source and drain electrodes are, for example, from about 40 nanometers to about 1 micrometer, including more specific thicknesses of from about 100 to about 400 nanometers.

Typical materials suitable for use as source and drain electrodes include those of the gate electrode materials such as gold, silver, nickel, aluminum, platinum, conducting polymers, and conducting inks. In specific embodiments, the electrode materials provide low contact resistance to the semiconductor. Typical thicknesses are about, for example, from about 40 nanometers to about 1 micrometer with a more specific thickness being about 100 to about 400 nanometers.

The source electrode is grounded and a bias voltage of, for example, about 0 volt to about 80 volts is applied to the drain electrode to collect the charge carriers transported across the semiconductor channel when a voltage of, for example, about +10 volts to about −80 volts is applied to the gate electrode. The electrodes may be formed or deposited using conventional processes known in the art.

If desired, a barrier layer may also be deposited on top of the TFT to protect it from environmental conditions, such as light, oxygen and moisture, etc. which can degrade its electrical properties. Such barrier layers are known in the art and may simply consist of polymers.

The various components of the OTFT may be deposited upon the substrate in any order. Generally, however, the gate electrode and the semiconducting layer should both be in contact with the gate dielectric layer. In addition, the source and drain electrodes should both be in contact with the semiconducting layer. The phrase "in any order" includes sequential and simultaneous formation. For example, the source electrode and the drain electrode can be formed simultaneously or sequentially. The term "on" or "upon" the substrate refers to the various layers and components with reference to the substrate as being the bottom or support for the layers and components which are on top of it. In other words, all of the components are on the substrate, even though they do not all directly contact the substrate. For example, both the dielectric layer and the semiconducting layer are on the substrate, even though one layer is closer to the substrate than the other layer. The resulting TFT has good mobility and good current on/off ratio.

The following examples are for purposes of further illustrating the present disclosure. The examples are merely illustrative and are not intended to limit devices made in accordance with the disclosure to the materials, conditions, or process parameters set forth therein. All parts are percentages by volume unless otherwise indicated.

EXAMPLES

Example 1

Suzuki

DPP copolymers were produced using a Suzuki polycondensation reaction according to Scheme 1, where R=:

P1

To a 100 mL 3-necked round bottom flask was added a 3:1 mixture of toluene and 2M aqueous $K_2CO_3$. 3-6 drops of a 50 wt % solution of aliquat 336 in toluene was added as a phase transfer catalyst. The flask was fitted with a condenser and the solvent mixture was deoxygenated for 30 minutes by bubbling with argon gas.

The flask was charged with the dibromide DPP—$Br_2$ (1.0 equivalents), boronic ester TT (1.01 equivalents) and Pd-132 (0.03 to 0.1 equivalents). The reaction was heated to an external temperature of 90° C. under an argon atmosphere and stirred at this temperature for 24 hours. After the polymerization was complete, the copolymers were end-capped by adding 2-bromothiophene (1.0 eq.) and stirring for 2 hours at 90° C., then adding 2-thiopheneboronic acid (1.0 eq.) and stirring for an additional 2 hours at 90° C. The heat was removed and the reaction mixture was cooled to room temperature.

Example 2

Stille

DPP copolymers were produced using a Stille polycondensation reaction illustrated in Scheme 2. The reaction occurred at 90° C. for 24 hours.

Scheme 2

DPP-Br₂

P2

Example 3

Testing of Ammonia Treatment

After polymerization, some copolymers P1 and P2 of Examples 1 and 2 were treated with 25% aqueous ammonia and stirred for at least 30 minutes at a temperature from about 20° C. to about 80° C. As controls, others were not.

The copolymers were then isolated according to the following procedure. The organic layer was separated and concentrated using a rotary evaporator. The crude copolymer P1 was precipitated with methanol and collected by vacuum filtration. The copolymer was purified by successive soxhlet extractions with methanol (6 hours, 95° C.), hexanes (18 hours, 90° C.) to remove lower molecular weight oligomers and impurities and then by extraction with $CHCl_3$ (2 hours, 90° C.) to extract the purified copolymer. The $CHCl_3$ extract was concentrated using a rotary evaporator and precipitated with methanol. The copolymer was collected by vacuum filtration and dried under high vacuum.

The purified copolymers were characterized by high temperature GPC to determine the molecular weight and by ICP-MS to determine the residual palladium content in the copolymers after ammonia treatment.

OTFT devices were fabricated on a silicon wafer substrate with a 200-nm silicon oxide layer serving as a gate dielectric layer. The silicon oxide layer was then modified with octyltrichlorosilane agent to obtain a hydrophobic surface. 12 milligrams of the DPP copolymer was dissolved in 2 grams of 1,1,2,2-tetrachloroethane solvent with the assistance of heat and shaking to form a dark blue solution. After filtering with a 0.2 urn syringe filter, the solution was spin coated at 2000 rpm onto the modified silicon wafer substrate. A very smooth and shiny semiconductor film was obtained. After being dried at 70° C. for about 30 minutes and annealed in a vacuum oven at 150° C. for 10 minutes, gold source/drain electrodes were vapor-evaporated on top of the semiconducting layer to form a series of transistors. At least 10 transistors were evaluated using a Keithley SCS4200 at ambient conditions.

The results are summarized in Table 1.

TABLE 1

| Polymer | Polymer-ization method | Ammonia treatment | $M_n$/PDI | Residual Pd (ppm) | $\mu_{max}/\mu_{avg}$ (cm$^2$/V · sec) |
|---|---|---|---|---|---|
| P2 | Stille | No | 19,301/2.0 | 609 | 0.66/0.52 |
| P2 | Stille | Yes | 11,736/2.2 | 473 | 1.23/0.94 |
| P1 | Suzuki | No | 15,226/2.3 | 1513 | 0.30/0.22 |
| P1 | Suzuki | Yes | 10,141/2.1 | 146 | 0.63/0.44 |
| P1 | Suzuki | Yes | 10,206/2.0 | 136 | 0.67/0.55 |

In all cases, copolymers treated with aqueous ammonia had lower palladium content and higher performance than identical polymers which were not subjected to ammonia treatment. Additional purification steps such as treatment with 2.5% aqueous HCl did not appreciably reduce the palladium content and had no further effect on the performance of the material.

Example 4

Testing of Palladium Scavenger

Some copolymers P1 were made similarly to Example 1. Instead of toluene, o-xylene was used. Instead of reaction at 90° C. for 24 hours, the reaction was at 70° C. for 24 hours.

The organic phase containing the crude polymer was isolated and treated with 25% aqueous ammonia and stirred for 30 minutes at 60° C. (2×). The organic phase was then treated with a Pd-scavenger, sodium diethyldithiocarbamate. The polymer was further purified using Soxhlet extraction with methanol and heptane. The purified polymer was extracted with CHCl$_3$, precipitated in methanol and isolated by vacuum filtration.

The purified polymer was characterized by high temperature GPC to determine the molecular weight and by ICP to determine the residual metal content in the copolymer before and after treatment with a Pd scavenger. The field-effect mobility was determined in a top-contact, bottom-gate device configuration using standard methods. The results are shown in Table 2.

TABLE 2

| Ammonia treatment | Pd-scavenger treatment | $M_w$/PDI | B (ppm) | K (ppm) | Pd (ppm) | $\mu_{avg}$ (cm$^2$/V · sec) |
|---|---|---|---|---|---|---|
| Yes | No | 43,673/2.62 | 1.6 | 0 | 740 | 0.44 ± 0.03 |
| Yes | Yes | 43,673/2.62 | 1.1 | 0 | 17 | 0.88 ± 0.09 |

Copolymers treated with only aqueous ammonia had low K and B content, but further purification was required to reduce the palladium content to below 100 ppm. After treatment with a Pd scavenger, sodium diethyldithiocarbamate, the Pd content was further reduced to below 100 ppm of Pd, leading to a dramatic increase in device performance. The polymers purified according to the processes of the present disclosure showed similar or better electrical performance than the control samples.

The present disclosure has been described with reference to exemplary embodiments. Obviously, modifications and alterations will occur to others upon reading and understanding the preceding detailed description. It is intended that the present disclosure be construed as including all such modifications and alterations insofar as they come within the scope of the appended claims or the equivalents thereof.

The invention claimed is:

1. A process for obtaining a diketopyrrolopyrrole copolymer having low palladium content, comprising:
   receiving an organic phase containing the diketopyrrolopyrrole copolymer;
   treating the organic phase with an aqueous ammonia solution at a tempature of from about 50° C. to about 80° C.;
   treating the organic phase with a palladium scavenger; and
   isolating the diketopyrrolopyrrole copolymer from the organic phase to obtain the diketopyrrolopyrrole copolymer having low palladium content.

2. The process of claim 1, wherein the diketopyrrolopyrrole copolymer has a palladium content of less than 150 ppm and a total metal content of less than 300 ppm.

3. The process of claim 1, wherein the diketopyrrolopyrrole copolymer having low palladium content has a weight average molecular weight of 20,000 or higher when measured using high-temperature gel permeation chromatography in trichlorobenzene at 140° C.

4. The process of claim 1, wherein the diketopyrrolopyrrole copolymer having low palladium content has a polydispersity index (PDI) of less than 4.0.

5. The process of claim 1, wherein the organic phase includes an organic solvent selected from the group consisting of anisole, toluene, ethylbenzene, o-xylene, m-xylene, p-xylene, trimethylbenzene, mesitylene, tetrahydronapthalene, and mixtures thereof.

6. The process of claim 1, wherein the palladium scavenger is sodium diethyldithiocarbamate, ethylenediamine tetraacetic acid (EDTA), or ethylene diamine.

7. The process of claim 1, wherein the palladium scavenger is a polymer containing a monomer selected from the group consisting of styryl sulfonic acid, vinyl pyridine, styryl thiol, and mercaptoethyl acrylate; or wherein the palladium scavenger includes a functional group selected from the group consisting of thiourea, benzyl amine, imidazolylalkyl, aminoalkyl, thioalkyl, imidazolylalkyl amino, mercaptophenyl amino, and aminoethyl amino.

8. The process of claim 1, wherein the aqueous ammonia solution contains from about 2% to about 30% ammonia (v/v).

9. The process of claim 1, wherein the organic phase is treated with the aqueous ammonia solution for a time period of 30 minutes to 90 minutes.

10. The process of claim 1, wherein the diketopyrrolopyrrole copolymer is isolated from the organic phase by extraction, precipitation, and vacuum filtration.

11. The process of claim 1, wherein the organic phase containing the diketopyrrolopyrrole copolymer is prepared by:
   reacting a reaction mixture that contains a diketopyrrolopyrrole monomer, an aryl comonomer, a palladium catalyst, an organic phase, and an aqueous phase, so that the diketopyrrolopyrrole copolymer is formed; and
   separating the organic phase containing the diketopyrrolopyrrole copolymer from the reaction mixture.

12. The process of claim 11, wherein the reacting occurs at a temperature of from 60° C. to 120° C.

13. The process of claim 11, wherein the reacting occurs for a time period of from about 6 hours to about 36 hours.

14. The process of claim 11, wherein the palladium catalyst is present in the amount of from about 1 mole % to about 5 mole % of the reaction mixture.

15. The process of claim 11, wherein the aqueous phase contains from 1 to 10 molar equivalents of a base, and wherein the volume ratio of organic phase to aqueous phase in the reaction mixture is from about 1:1 to about 5:1.

16. The process of claim 11, wherein the diketopyrrolopyrrole monomer has the structure of Formula (I):

Formula (I)

wherein $Ar_1$ and $Ar_2$ are independently aryl, substituted aryl, heteroaryl, or substituted heteroaryl;

$R_1$ and $R_2$ are independently hydrogen, alkyl, substituted alkyl, poly(ethylene glycol), poly(propylene glycol), aryl, substituted aryl, heteroaryl, or substituted heteroaryl; and

$Y_1$ and $Y_2$ are independently halogen.

17. The process of claim 16, wherein $Ar_1$ and $Ar_2$ are independently selected from the group consisting of thiophene, furan, thienothiophene, and selenophene.

18. The process of claim 11, wherein the aryl comonomer is an aryl boronate having the structure of Formula (III):

BE-Ar''—BE        Formula (III)

wherein BE is selected from the group consisting of:

, and ;

and wherein Ar'' is selected from the group consisting of:

and wherein each R' is independently selected from hydrogen, alkyl, substituted alkyl, poly(ethylene glycol), poly(propylene glycol), aryl, substituted aryl, heteroaryl, substituted heteroaryl, halogen, alkoxy, alkylthio, trialkylsilyl, —CN, or —$NO_2$; and X is C or Si.

19. The process of claim 11, wherein the palladium catalyst has the structure of Formula (IV):

Formula (IV)

wherein $R^a$ is H, —$N(CH_3)_2$, or —$CF_3$.

20. The process of claim 19, wherein $R^a$ is —$N(CH_3)_2$.

* * * * *